United States Patent
Brueckler

(10) Patent No.: US 8,036,616 B2
(45) Date of Patent: Oct. 11, 2011

(54) NOISE PARAMETER DETERMINATION METHOD

(75) Inventor: Anton Brueckler, Jennersdorf (AT)

(73) Assignee: Infineon Technologies AG, Neubiberg (DE)

( * ) Notice: Subject to any disclaimer, the term of this patent is extended or adjusted under 35 U.S.C. 154(b) by 696 days.

(21) Appl. No.: 12/115,052

(22) Filed: May 5, 2008

(65) Prior Publication Data

US 2009/0275301 A1 Nov. 5, 2009

(51) Int. Cl.
*H04B 17/00* (2006.01)
*G01R 29/26* (2006.01)

(52) U.S. Cl. .................. 455/226.1; 455/67.11; 324/614

(58) Field of Classification Search ............... 455/226.1, 455/226.2, 226.3, 67.11; 324/613, 614
See application file for complete search history.

(56) References Cited

U.S. PATENT DOCUMENTS

| | | | |
|---|---|---|---|
| 4,905,308 A | 2/1990 | Davidson | |
| 5,034,708 A | 7/1991 | Adamian et al. | |
| 6,114,858 A * | 9/2000 | Kasten | 324/616 |
| 6,674,293 B1 | 1/2004 | Tsironis | |
| 7,271,576 B1 | 9/2007 | O'Harra, II | |
| 2002/0026300 A1 | 2/2002 | Shimazaki | |

FOREIGN PATENT DOCUMENTS

| | | |
|---|---|---|
| DE | 0153 639 | 1/1982 |
| EP | 1 093 222 A1 | 4/2001 |

* cited by examiner

*Primary Examiner* — Nguyen Vo

(74) *Attorney, Agent, or Firm* — Dickstein Shapiro LLP

(57) ABSTRACT

According to an aspect of the present description a method for determining selected parameters of a noise characterization equation which describes a noise performance of a device as a function of a controllable variable of the device is provided. The method includes selecting a number of different values of the controllable variable of the device, the number of different values being equal to or larger than the number of parameters that are to be determined; measuring the noise performance of the device for the different values; utilizing the noise characterization equation to set up a number of independent relations which relate the parameters with the measurement results, the number of independent relations being equal to the number of parameters that are to be determined; and determining the parameters from the relations.

11 Claims, 2 Drawing Sheets

NOISE PARAMETER DETERMINATION METHOD

BACKGROUND

In the field of wireless communications there is a demand for a continuous improvement of the sensitivity of the devices. The sensitivity of a device is typically described with the help of noise parameters. For example noise figure parameter (NF-parameters) and noise figure circles (NF-circles) are usually used for an optimum matching of a low noise amplifier (LNA).

It is therefore a need for an economical method for determining the desired parameters.

SUMMARY

According to an aspect of the present description a method for determining selected parameters of a noise characterization equation which describes a noise performance of a device as a function of a controllable variable relevant to the device is provided. The method includes: selecting a number of different values of the controllable variable relevant to the device, the number of different values being equal to or larger than the number of parameters that are to be determined; measuring the noise performance of the device for the different values; utilizing the noise characterization equation to set up a number of independent relations which relate the parameters with the measurement results, the number of independent relations being equal to the number of parameters that are to be determined; and determining the parameters from the relations.

DRAWINGS

Embodiments are depicted in the drawings and are detailed in the description which follows.

In the drawings.

In the figures same reference numerals denote the same or similar parts or steps.

DESCRIPTION

Figure 1:
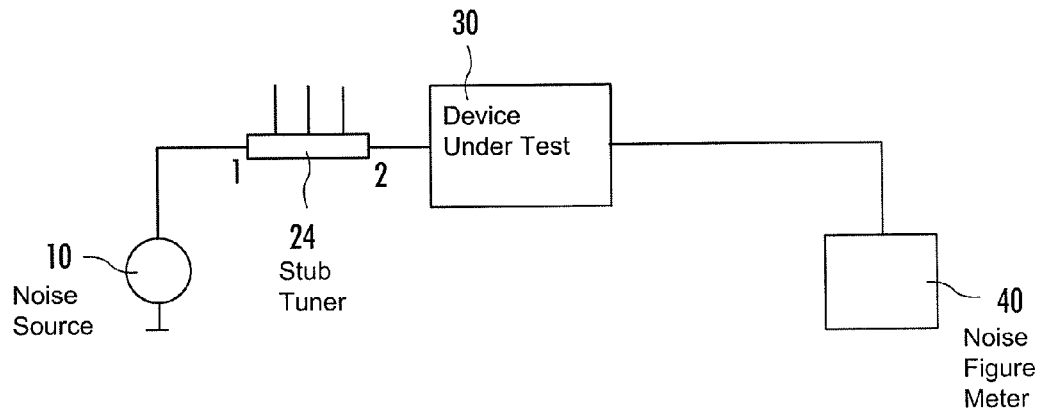
FIG. 1 shows a measurement set-up according to an embodiment of the present invention.

An aspect of the present description is to provide a method to determine the relevant noise parameters from a comparatively small number of measurement points. In particular, a method is provided for determining selected parameters of a noise characterization equation which describes a noise performance of a device as a function of a controllable variable relevant to the device. Preferably, noise characterization equation is expressed in term of the so called noise figure (NF).

In telecommunication, noise figure (NF) is a measure of degradation of the signal to noise ratio (SNR), caused by components in the signal chain. The noise figure is the ratio of the output noise power of a device to the portion thereof attributable to thermal noise in the input termination at standard noise temperature T (usually 290 K). The noise figure is thus the ratio of actual output noise to that which would remain if the device itself did not introduce noise.

Furthermore, the parameters preferably contained in the noise characterization equation are the minimum noise figure (NFmin), the corresponding reflection coefficient or impedance (real part and imaginary part) and the noise resistance.

In the following it is described how a noise characterization equation can be utilized to set up a number of independent relations which relate the desired parameters with the measurement results. Preferably, the noise characterization equation is equivalent to following equation $$1) \; NF = NF_{min} + \frac{4 \cdot R_n}{Z_0} \cdot \frac{|\Gamma_{OPT} - \Gamma_S|^2}{|1 + \Gamma_{OPT}|^2 \cdot (1 - |\Gamma_S|^2)}$$

wherein the parameter $NF_{min}$ denotes the minimum noise figure, the parameter $R_n$ denotes the noise resistance, the parameter $\Gamma_{OPT}$ denotes the optimum reflection coefficient, and the parameter $Z_0$ denotes a standard impedance. Equation 1) describes the noise figure of a device as a function of reflection coefficient $\Gamma_S$. The reflection coefficient is a complex number having a real part $\Gamma_{S \; real}$ and an imaginary part $\Gamma_{S \; imag}$. The same applies for parameter $\Gamma_{OPT}$, which has a real part $\Gamma_{OPT \; real}$ and an imaginary part $\Gamma_{OPT \; imag}$. Thereby, a reflection coefficient can be transformed into a corresponding impedance and vice versa.

From those parameters that appear in equation 1) the minimum noise figure, the noise resistance and the optimum reflection coefficient are selected so that their respective values can be determined.

For that purpose it is convenient to modify equation 1, so that it takes the following form:

$$2) \; NF = NF_{min} - \frac{4 \cdot R_n}{Z_0 \cdot (1 + 2\Gamma_{OPT \; real} + \Gamma_{OPT \; real}^2 + \Gamma_{OPT \; imag}^2)} + \frac{4 \cdot R_n}{Z_0 \cdot (1 - |\Gamma_S|^2)} - \frac{8 \cdot (1 + \Gamma_{S \; real})}{Z_0 \cdot (1 - |\Gamma_S|^2)} \cdot \frac{\Gamma_{OPT \; real} \cdot R_n}{Z_0 \cdot (1 + 2\Gamma_{OPT \; real} + \Gamma_{OPT \; real}^2 + \Gamma_{OPT \; imag}^2)} - \frac{8 \cdot \Gamma_{S \; imag}}{Z_0 \cdot (1 - |\Gamma_S|^2)} \cdot \frac{\Gamma_{OPT \; imag} \cdot R_n}{Z_0 \cdot (1 + 2\Gamma_{OPT \; real} + \Gamma_{OPT \; real}^2 + \Gamma_{OPT \; imag}^2)}$$

Using the additional variables $x_1$, $x_2$, $x_3$ and $x_4$:

$$3a.) \; x_1 = NF_{min} - \frac{4 \cdot R_n}{Z_0 \cdot (1 + 2\Gamma_{OPT \; real} + \Gamma_{OPT \; real}^2 + \Gamma_{OPT \; imag}^2)}$$

$$3b.) \; x_2 = R_n$$

$$3c.) \; x_3 = \frac{\Gamma_{OPT \; real} \cdot R_n}{Z_0 \cdot (1 + 2\Gamma_{OPT \; real} + \Gamma_{OPT \; real}^2 + \Gamma_{OPT \; imag}^2)}$$

$$3d.) \; x_4 = \frac{\Gamma_{OPT \; imag} \cdot R_n}{Z_0 \cdot (1 + 2\Gamma_{OPT \; real} + \Gamma_{OPT \; real}^2 + \Gamma_{OPT \; imag}^2)}$$

Equation 2) takes the following form:

$$4.) \; NF = x_1 + \frac{4}{Z_0 \cdot (1 - |\Gamma_S|^2)} \cdot x_2 - \frac{8 \cdot (1 + \Gamma_{S \; real})}{Z_0 \cdot (1 - |\Gamma_S|^2)} \cdot x_3 - \frac{8 \cdot \Gamma_{S \; imag}}{Z_0 \cdot (1 - |\Gamma_S|^2)} \cdot x_4$$

Equation 4) can also be written as $$4b.)\ NF_x = x_1 + A_x \cdot x_2 + B_x \cdot x_3 + C_x \cdot x_4$$

$$A_x = \frac{4}{Z_0 \cdot (1 - |\Gamma_{Sx}|^2)}$$

$$B_x = -\frac{8 \cdot (1 + \Gamma_{S\ real\ x})}{Z_0 \cdot (1 - |\Gamma_{Sx}|^2)}$$

$$C_x = -\frac{8 \cdot 1 + \Gamma_{S\ imag\ x}}{Z_0 \cdot (1 - |\Gamma_{Sx}|^2)}$$

where

To be able to calculate the values of $x_1$, $x_2$, $x_3$ and $x_4$ and furthermore $\Gamma_{OPT\ real}$, $\Gamma_{OPT\ imag}$, Rn and NFmin, at least four different values of the reflection coefficient $\Gamma_S$ are selected and the corresponding values of the NF are measured. Inserting the measured NF-values and the corresponding values of $\Gamma_S$ ($\Gamma_{S\ real}$ and $\Gamma_{S\ imag}$) in formula 4 or 4b yields a system of four independent relations enabling to calculate the for different values $\Gamma_{OPT\ real}$, $\Gamma_{OPT\ imag}$, Rn and NFmin by using the additional variables $x_1$, $x_2$, $x_3$ and $x_4$.

Inserting into 4b yields $$NF_1 = x_1 + A_1 \cdot x_2 + B_1 \cdot x_3 + C_1 \cdot x_4 \quad \text{5a.)}$$

$$NF_2 = x_1 + A_2 \cdot x_2 + B_2 \cdot x_3 + C_2 \cdot x_4 \quad \text{5b.)}$$

$$NF_3 = x_1 + A_3 \cdot x_2 + B_3 \cdot x_3 + C_3 \cdot x_4 \quad \text{5c.)}$$

$$NF_4 = x_1 + A_4 \cdot x_2 + B_4 \cdot x_3 + C_4 \cdot x_4 \quad \text{5d.)}$$

Thus relations 5a to 5d relate the desired parameters $\Gamma_{OPT\ real}$, $\Gamma_{OPT\ imag}$, Rn and NFmin with the measurement results ($NF_1$ at $\Gamma_1$), (NF2 at $\Gamma_2$), ($NF_3$ at $\Gamma_3$), and ($NF_4$ at $\Gamma_4$). Solving these relations with regard to by $x_1$, $x_2$, $x_3$ and $x_4$ yields the following equations:

$$6a.)\ x_1 = \frac{\xi_1 \cdot (\gamma_2 \cdot \beta_3 - \gamma_3 \cdot \beta_2) + \xi_2 \cdot (\gamma_3 \cdot \beta_1 - \gamma_1 \cdot \beta_3) + \xi_3 \cdot (\gamma_1 \cdot \beta_2 - \gamma_2 \cdot \beta_3)}{\Delta A_1 \cdot (\gamma_2 \cdot \beta_3 - \gamma_3 \cdot \beta_2) + \Delta A_2 \cdot (\gamma_3 \cdot \beta_1 - \gamma_1 \cdot \beta_3) + \Delta A_3 \cdot (\gamma_1 \cdot \beta_2 - \gamma_2 \cdot \beta_3)}$$

with $$\xi_1 = F_1 \cdot A_2 - F_2 \cdot A_1$$
$$\xi_2 = F_2 \cdot A_3 - F_3 \cdot A_2$$
$$\xi_3 = F_3 \cdot A_4 - F_4 \cdot A_3$$
$$\beta_1 = B_1 \cdot A_2 - B_2 \cdot A_1$$
$$\beta_2 = B_2 \cdot A_3 - B_3 \cdot A_2$$
$$\beta_3 = B_3 \cdot A_4 - B_4 \cdot A_3$$
$$\gamma_1 = C_1 \cdot A_2 - C_2 \cdot A_1$$
$$\gamma_2 = C_2 \cdot A_3 - C_3 \cdot A_2$$
$$\gamma_3 = C_3 \cdot A_4 - C_4 \cdot A_3$$
$$\Delta A_1 = A_2 - A_1$$
$$\Delta A_2 = A_3 - A_2$$
$$\Delta A_3 = A_4 - A_3$$

-continued $$6b.)\ x_2 = \frac{\begin{array}{l}(NF_1 - NF_2) \cdot \left[\begin{array}{l}(C_2 - C_3) \cdot (B_3 - C_4) - \\ (C_3 - C_4) \cdot (B_2 - B_3)\end{array}\right] + \\ (NF_2 - NF_3) \cdot \left[\begin{array}{l}(C_3 - C_4) \cdot (B_1 - B_2) - \\ (C_1 - C_2) \cdot (B_3 - B_4)\end{array}\right] + \\ (NF_3 - NF_4) \cdot \left[\begin{array}{l}(C_1 - C_2) \cdot (B_2 - B_3) - \\ (C_2 - C_3) \cdot (B_1 - B_2)\end{array}\right]\end{array}}{\begin{array}{l}(A_1 - A_2) \cdot \left[\begin{array}{l}(C_2 - C_3) \cdot (B_3 - C_4) - \\ (C_3 - C_4) \cdot (B_2 - B_3)\end{array}\right] + \\ (A_2 - A_3) \cdot \left[\begin{array}{l}(C_3 - C_4) \cdot (B_1 - B_2) - \\ (C_1 - C_2) \cdot (B_3 - B_4)\end{array}\right] + \\ (A_3 - A_4) \cdot \left[\begin{array}{l}(C_1 - C_2) \cdot (B_2 - B_3) - \\ (C_2 - C_3) \cdot (B_1 - B_2)\end{array}\right]\end{array}}$$

$$6c.)\ x_3 = \frac{\begin{array}{l}(NF_1 - NF_2) \cdot \left[\begin{array}{l}(C_2 - C_3) \cdot (B_3 - C_4) - \\ (C_3 - C_4) \cdot (B_2 - B_3)\end{array}\right] + \\ (NF_2 - NF_3) \cdot \left[\begin{array}{l}(C_3 - C_4) \cdot (B_1 - B_2) - \\ (C_1 - C_2) \cdot (B_3 - B_4)\end{array}\right] + \\ (NF_3 - NF_4) \cdot \left[\begin{array}{l}(C_1 - C_2) \cdot (B_2 - B_3) - \\ (C_2 - C_3) \cdot (B_1 - B_2)\end{array}\right]\end{array}}{\begin{array}{l}(B_1 - B_2) \cdot \left[\begin{array}{l}(C_2 - C_3) \cdot (B_3 - C_4) - \\ (C_3 - C_4) \cdot (B_2 - B_3)\end{array}\right] + \\ (B_2 - B_3) \cdot \left[\begin{array}{l}(C_3 - C_4) \cdot (B_1 - B_2) - \\ (C_1 - C_2) \cdot (B_3 - B_4)\end{array}\right] + \\ (B_3 - B_4) \cdot \left[\begin{array}{l}(C_1 - C_2) \cdot (B_2 - B_3) - \\ (C_2 - C_3) \cdot (B_1 - B_2)\end{array}\right]\end{array}}$$

$$6d.)\ x_4 = \frac{\begin{array}{l}(NF_1 - NF_2) \cdot \left[\begin{array}{l}(C_2 - C_3) \cdot (B_3 - C_4) - \\ (C_3 - C_4) \cdot (B_2 - B_3)\end{array}\right] + \\ (NF_2 - NF_3) \cdot \left[\begin{array}{l}(C_3 - C_4) \cdot (B_1 - B_2) - \\ (C_1 - C_2) \cdot (B_3 - B_4)\end{array}\right] + \\ (NF_3 - NF_4) \cdot \left[\begin{array}{l}(C_1 - C_2) \cdot (B_2 - B_3) - \\ (C_2 - C_3) \cdot (B_1 - B_2)\end{array}\right]\end{array}}{\begin{array}{l}(C_1 - C_2) \cdot \left[\begin{array}{l}(C_2 - C_3) \cdot (B_3 - C_4) - \\ (C_3 - C_4) \cdot (B_2 - B_3)\end{array}\right] + \\ (C_2 - C_3) \cdot \left[\begin{array}{l}(C_3 - C_4) \cdot (B_1 - B_2) - \\ (C_1 - C_2) \cdot (B_3 - B_4)\end{array}\right] + \\ (C_3 - C_4) \cdot \left[\begin{array}{l}(C_1 - C_2) \cdot (B_2 - B_3) - \\ (C_2 - C_3) \cdot (B_1 - B_2)\end{array}\right]\end{array}}$$

After having calculated $x_1$, $x_2$, $x_3$ and $x_4$ finally $\Gamma_{OPT\ real}$, $\Gamma_{OPT\ imag}$, Rn and NFmin can be calculated as follows:

$$7.)\ \Gamma_{OPT\ real} = \left(\frac{x_3}{x_2}\right) \cdot \frac{1 - 2 \cdot \frac{x_3}{x_2}(+) - \sqrt{1 - 4 \cdot \frac{x_3}{x_2} - 4 \cdot \left(\frac{x_4}{x_2}\right)^2}}{2 \cdot \left[\left(\frac{x_3}{x_2}\right)^2 + \left(\frac{x_4}{x_2}\right)^2\right]}$$

$$8.)\ \Gamma_{OPT\ imag} = \left(\frac{x_4}{x_2}\right) \cdot \frac{1 - 2 \cdot \frac{x_3}{x_2}(+) - \sqrt{1 - 4 \cdot \frac{x_3}{x_2} - 4 \cdot \left(\frac{x_4}{x_2}\right)^2}}{2 \cdot \left[\left(\frac{x_3}{x_2}\right)^2 + \left(\frac{x_4}{x_2}\right)^2\right]}$$

$$= \frac{x_4}{x_2} \cdot \Gamma_{OPT\ imag}$$

$$9.)\ R_n = x_2$$

and

-continued

10.) $NF_{min} = x_1 + \cdot \dfrac{8 \cdot (x_3^2 + x_4^2) \cdot \dfrac{1}{x_2}}{Z_0 \cdot \left(1 - 2 \cdot \dfrac{x_3}{x_2}(+) - \sqrt{1 - 4 \cdot \dfrac{x_3}{x_2} - 4 \cdot \left(\dfrac{x_4}{x_2}\right)^2}\right)}$ As outlined above, in the present example only four NF-measurements are necessary to determine the desired NF-parameters from equation 1. As the parameter $\Gamma_{OPT}$ is found by calculation using exact formulas from four measurements at different reflections coefficients, instead of approximation by searching $\Gamma_{OPT}$ (where the accuracy is dependent on the step size and therefore on the amount of measurements), the accuracy of the value of the parameter $\Gamma_{OPT}$ is high. Furthermore measurement points showing sufficient gain can be chosen to keep the influence of the measurement device sufficiently small.

As a numerical example a measurement using four reflection coefficients or impedance values was performed:
 a. $\Gamma_1 = 0.2 + j0 \Rightarrow NF_1 = 2.1$
 b. $\Gamma_2 = 0.2 + j0.5 \Rightarrow NF_2 = 2.2$
 c. $\Gamma_3 = -0.1 - j0.3 \Rightarrow NF_3 = 3.2$
 d. $\Gamma_4 = 0.5 + j0.6 \Rightarrow NF_4 = 2.4$
yields the following noise parameter:
 e. NFmin=1,803=2,559 dB
 f. Rn=54,9563Ω
 g. $\Gamma_{OPT} = 0.492099 + j0.2517460$ In addition to noise parameters noise figure circles may also be used to describe the noise behavior of a device. The noise figure circles are non concentric circles in the Smith-Chart characterized by the same NF of all points on the respective circle and the reflection coefficient of the optimum NF anywhere in the center of these circles. So for example, beside the reflection coefficient of the optimum NF, circles showing a 0.5 dB, 1 dB, 1.5 dB . . . larger NF than the optimum NF can be inserted and displayed in the Smith-Chart.

The NF-circles are calculated by derive both the x-value and the y-value of $\Gamma_S$ of points of the circle from formula 1. For that purpose once the x-value of $\Gamma_{OPT}$ has to be inserted as x-value of $\Gamma_S$ (and of course $\Gamma_{OPT}$ and Fmin) into this formula, to get the corresponding y-values of $\Gamma_S$ and once to insert the y-value of $\Gamma_{OPT}$ as y-value of $\Gamma_S$ (and of course $\Gamma_{OPT}$ and Fmin) into this formula, to get the x-values of $\Gamma_S$.

For the noise characterization equation 1) it can be shown that the four measurements points (reflection coefficients) must not lie on one and the same line or on one and the same circle in the Smith-Diagram. If this would be the case no solution of the equation system 5a to 5d would be possible. Therefore, it is helpful when a check is performed whether the selected impedance values yield a sufficient number of independent relations which relate the parameters with the measurement results.

In order to avoid measurements that may then not be usable for the determination of the desired parameters, it is also helpful to select a number of different impedance values of the device, the number of different impedance values being less than the number of parameters that are to be determined. Based on the selected impedance values those values for the remaining impedance points, that are not to be selected, are determined.

In the above described example three impedance values were selected and the forbidden coordinates of the fourth measurement point were determined. The line or circle representing the forbidden reflection coefficient for the fourth measurement may, for example, be indicated in a corresponding Smith-Diagram. In addition the forbidden imaginary value of this point may be indicated as warning after the real value of the this point has been selected.

One possibility to measure the noise figure NF at a certain input impedance is described with reference to FIG. 1. In FIG. 1 the device whose noise performance is to be determined is illustrated at reference number 30. A noise source 10 is used to supply a noise signal to the input of the device under test (DUT) 30 via a stub tuner 24. The stub tuner 24 is used to adjust the impedance as seen at the input of the device under test 30. Accordingly, the stub tuner 24 is used to select different input impedance values of the device under test 30. On the output of the device under test 30 a noise figure meter 40 is used to measure the noise figure of the device 30 for the different input impedance values.

Figure 2:
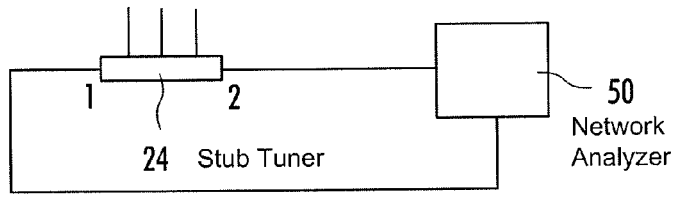
FIG. 2 shows a set-up in order to select a desired input impedance value.

To adjust the input impedance of the device 30 present on the output 2 of the stub tuner 24 to a desired value a network analyser (NA) 50 is used, as can be seen FIG. 2. The input port 1 of the stub tuner 24 can be terminated either by a 50Ω termination or connected to a corresponding port of the network analyser 50. The stub tuner 24 includes one or more short-circuited, variable length lines (stubs) connected to the primary transmission line reaching from the input port 1 to the output port 2. Thereby each stub is movable over a certain range, in order to adjust a desired impedance value. Once the desired impedance value is measured by the network analyzer 50, the corresponding stub positions are fixed and the stub tuner 24 is reconnected with the input of the device under test 30.

Figure 3:
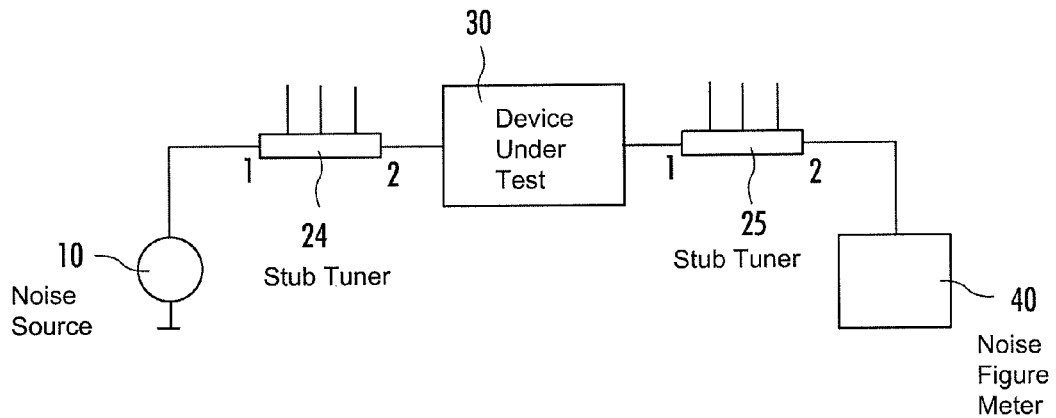
FIG. 3 shows a measurement set-up according to another embodiment of the present invention.

In order to increase the accuracy of the measurement, it is preferred that the output impedance of the device under test is transformed to 50Ω. Thus, as can be seen from FIG. 3, the output of the device under test 30 is connected to the input port 1 of a second stub tuner 25. The transformation of the DUT output impedance to 50Ω helps to reach a higher accuracy, as the calibration of the noise figure meter 40 is typically related to the 50Ω impedance of the noise source 10.

Figure 4:
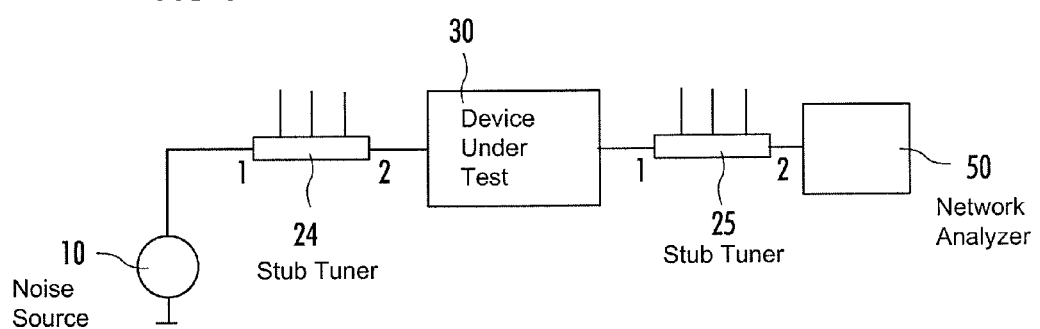
FIG. 4 shows a set-up in order to select a desired output impedance value.

The stubs of the stub tuner 25 can be adjusted by measuring directly on the output 2 of the second stub tuner 25 using the network analyzer 50 until 50Ω is reached (FIG. 4). Afterwards the output 2 of the second stub tuner 25 is connected to the measuring input of the noise figure meter 40 to measure the NF of the device under test at this particular input impedance.

The measurement result achieved in the described manner represents the system noise figure including, in addition to the device under test 30, also the first and second stub tuner 24 and 25 and additional cables, which were not used during the calibration of the noise figure meter 40. Thus this value has to be corrected by using the Friis-formula with the known noise figure of each additional component, namely the first and second stub tuners 24 and 25 and additional cables.

Based on the measured values the noise parameters of the device under test can be determined. These noise parameters may then be used to chance certain properties of the device under test itself or to design corresponding matching networks used for example at the input of the device under test such that the overall the sensitivity requirements can be met.

The invention claimed is:

1. A method for determining selected parameters of a noise characterization equation which describes a noise performance of a device as a function of a controllable variable relevant to the device, comprising:
 selecting, by a stub tuner, a number of different values of the controllable variable relevant to the device, the number of different values being equal to or larger than the number of parameters that are to be determined;

measuring, by a noise figure meter, the noise performance of the device for the different values;

utilizing the noise characterization equation to set up a number of independent relations which relate the parameters with the measurement results, the number of independent relations being equal to the number of parameters that are to be determined;

determining the parameters from the relations; and utilizing the noise characterization equation with the determined parameters to improve the noise performance of the device.

2. The method according to claim 1,
wherein the controllable variable is an impedance relevant to the device.

3. The method according to claim 2,
wherein the noise characterization equation describes a noise performance of the device as a function of input impedance relevant to the device.

4. The method according to claim 1,
wherein noise performance is given in a form of a noise figure.

5. The method according to claim 1,
wherein the selected parameters include a minimum noise figure.

6. The method according to claim 1,
wherein the selected parameters include noise resistance.

7. The method according to claim 1,
wherein the selected parameters include optimum impedance.

8. The method according to claim 1,
wherein the noise characterization equation is equivalent to:

$$NF = NF_{min} + \frac{4 \cdot R_n}{Z_0} \cdot \frac{|\Gamma_{OPT} - \Gamma_S|^2}{|1 + \Gamma_{OPT}|^2 \cdot (1 - |\Gamma_S|^2)}.$$

wherein the parameter $NF_{min}$ denotes a minimum noise figure, the parameter $R_n$ denotes noise resistance, the parameter $\Gamma_{OPT}$ denotes optimum reflection coefficient, and the parameter $Z_0$ denotes a standard impedance.

9. The method according to claim 1,
wherein the relations which relate the parameters with the measurement results are in equation form.

10. The method according to claim 1, further comprising:
checking whether the selected values yield a sufficient number of independent relations which relate the parameters with the measurement results.

11. The method according to claim 1, further comprising:
selecting, by the stub tuner, a number of different values of the controllable variable relevant to the device, the number of different values being less than the number of parameters that are to be determined; and
determining based on the selected values, those values of the remaining values that should not be selected.

* * * * *